United States Patent [19]

Larson

[11] 4,342,065
[45] Jul. 27, 1982

[54] PROTECTION CIRCUIT FOR A DATA DRIVER

[75] Inventor: Robin R. Larson, Aloha, Oreg.

[73] Assignee: Tektronix, Inc., Beaverton, Oreg.

[21] Appl. No.: 252,985

[22] Filed: Apr. 10, 1981

[51] Int. Cl.³ .............................................. H02H 9/00
[52] U.S. Cl. ...................................... 361/93; 307/473; 307/471; 307/239; 361/100
[58] Field of Search ..................... 361/93, 86, 91, 100, 361/101; 307/473, 470, 471, 443, 239, 248, 254, 573-579, 200 A, 359; 330/207 P, 298

[56] References Cited

U.S. PATENT DOCUMENTS

| | | | |
|---|---|---|---|
| 3,761,775 | 9/1973 | Ozawa et al. | 361/86 |
| 3,792,292 | 2/1974 | Priel | 307/473 |
| 3,931,547 | 1/1976 | Glogolja | 330/207 P |
| 4,031,559 | 6/1977 | Peters | 361/86 X |
| 4,194,131 | 3/1980 | Mrazek et al. | 307/473 |

Primary Examiner—Reinhard J. Eisenzopf
Attorney, Agent, or Firm—George T. Noe

[57] ABSTRACT

Disclosed herein is a circuit for protecting an inhibitable tristate data driver from damage due to an over current. A logic comparator circuit compares input and output logic levels of the data driver, and inhibits the driver causing the output to go to a tristate if a fault occurs.

7 Claims, 4 Drawing Figures

PROTECTION CIRCUIT FOR A DATA DRIVER

BACKGROUND OF THE INVENTION

The present invention relates to a circuit which protects a data driver from damage due to an over current.

The data driver is used as an output stage of a logic apparatus such as, for example, a digital word generator which applies digital words to a PUT (product under test) for a measurement or troubleshooting. The output impedance of the data driver must be low for applying effectively the output digital words to the PUT. Sometimes, an undesirable fault happens due to an operator's mistake or a malfunction of the PUT, i.e., the output end of the data driver is shorted to a high level portion of the PUT when the output is a low level, or the output end thereof is shorted to a low level portion of the PUT when the output is a high level. In this instance, a large or over current flows through the data driver because of the low input impedance thereof, and the driver may be damaged. Therefore, a protection circuit is necessary to protect the driver from the damage due to the over current.

One conventional protection circuit is disclosed in U.S. Pat. No. 3,495,179. This circuit comprises an operational amplifier having a non-linear feedback network and an overload indicator, wherein the feedback network reduces the gain of the operational amplifier in response to input signals having a magnitude exceeding a threshold overload value. However, this circuit is not proper for the above data driver, because the input logic levels are predetermined and do not exceed the threshold overload value. Thus, the prior art circuit cannot protect the data driver from the damage due to the short of the data driver's output.

U.S. Pat. No. 3,849,734 discloses another protection circuit, wherein a comparator compares an output voltage from an amplifier with a predetermined voltage, and shunts input terminals of the amplifier when the output voltage exceeds the predetermined voltage. This circuit, however, cannot protect the data driver from the damage due to the short of the output terminal, because the logic high and low levels are predetermined, and the voltage at the output end of the data driver does not exceed the predetermined high and low levels even if the output end is shorted to the opposite logic level.

U.S. Pat. No. 4,216,517 discloses another protection circuit which comprises a current detecting section for detecting a level of a load current of an amplifier, a voltage detecting section for detecting a level of a load voltage across a load, an AND-gate circuit responsive to outputs of the current and voltage sections for detecting a short-circuit of the load, and a control section responsive to an output of the AND-gate circuit for disconnecting the load from the amplifier. This circuit is complex and expensive in construction. Since the digital word generator generates many parallel bits such as 8, 16 or 32 bits, the protection circuits for the data drivers are bulky because the protection circuit is needed for each bit.

SUMMARY OF THE INVENTION

According to the present invention, a logic comparator circuit compares the input and output logic levels of the tristate data driver, and the data driver is inhibited causing the output to go a tristate in response to the output of the logic comparator circuit. The inhibitable data driver has three states, wherein two states are the high and low levels with the low output impedance, and the tristate is the high output impedance. When a fault occurs, the output impedance of the data driver is changed from low to high for protecting the driver from the damage. Conventional IC's may be used as the data driver and the logic comparator circuit.

It is therefore one object of the present invention to provide a protection circuit for a data driver which is simple and inexpensive in construction.

It is another object to provide a circuit for protecting a data driver from damage due to an over current.

It is a further object to provide a protection circuit which works without compromising the low impedance drive characteristics of most data drivers.

It is an additional object to provide a protection circuit wherein a data driver does not go into a state of high dissipation when a fault occurs.

Other objects and advantages of the present invention will become apparent to those having ordinary skill in the art when taken in conjunction with the accompanying drawings.

DRAWINGS

DETAILED DESCRIPTION OF THE INVENTION

Figure 1:
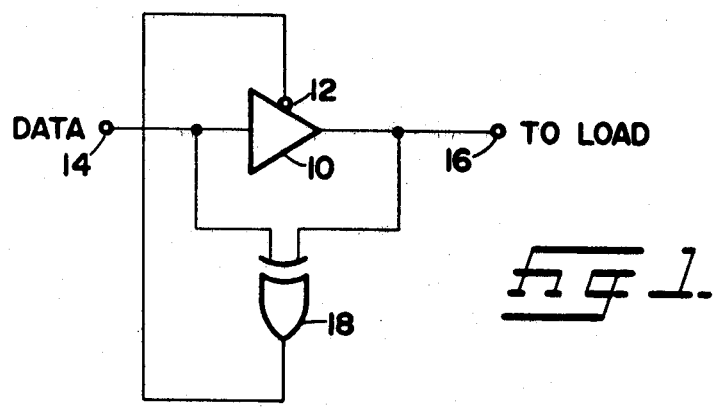
FIG. 1 shows a circuit schematic of a first embodiment according to the present invention.

Referring to FIG. 1, there is shown a circuit schematic of a first embodiment according to the present invention. Non-inverting data driver 10 is a tristate inhibitable driver having enable terminal 12 (negative logic), and is inserted between input and output terminals 14 and 16. Logic comparator circuit or exclusive OR gate 18 compares the input and output of data driver 12 to control enable terminal 12 of data driver 10.

In a normal mode of operation, the input and output logic levels of data driver 10 are equal to each other, and exclusive OR gate 18 generates the low level to enable data driver 10. While data driver 10 is enabled, the output impedance is low and the output logic level responds to the input logic level.

When a fault occurs, i.e., output terminal 16 is shorted to a high level portion while the output of driver 10 is the low level or terminal 16 is shorted to a low level portion while the output is the high level, the level at terminal 16 changes to the opposite logic level determined by the portion connected to terminal 16. Since two input logic levels of exclusive OR gate 18 are different, the output of gate 18 becomes the high level to disable data driver 10. The output of data driver 10 goes the tristate, i.e., the output impedance becomes high to reduce the current flowing through driver 10 so as to protect driver 10 from the damage. When the output logic level becomes the same as the input logic level, data driver returns to the normal mode of operation.

For example, data driver 10 may be type SN 74 S 244 driver. In this IC, the high-level output current is −15 mA and the low-level output current is 64 mA. When the high-level voltage is applied to the output end of the IC, the off (disable) state output current is 50 μA. When the low-level voltage is applied to the output end, the off-state output current is −50 μA.

Figure 2:
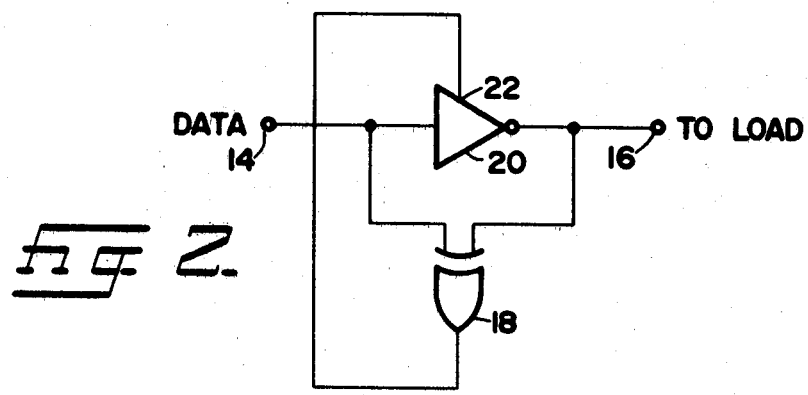
FIG. 2 shows a circuit schematic of a second embodiment according to the present invention.

Another embodiment of the present invention is shown in FIG. 2. This embodiment is similar to that of FIG. 1 so that the same reference numbers have been employed to designate like parts and only the differences will be discussed. Data driver 22 is a tristate inverting driver having enable terminal 22 (positive logic). Data driver 22 is inhibited causing the output to go the tristate, when two input logic levels of exclusive OR gate 18 are equal to each other. If gate 18 is an exclusive NOR, enable terminal 22 maybe the negative logic.

Figure 3:
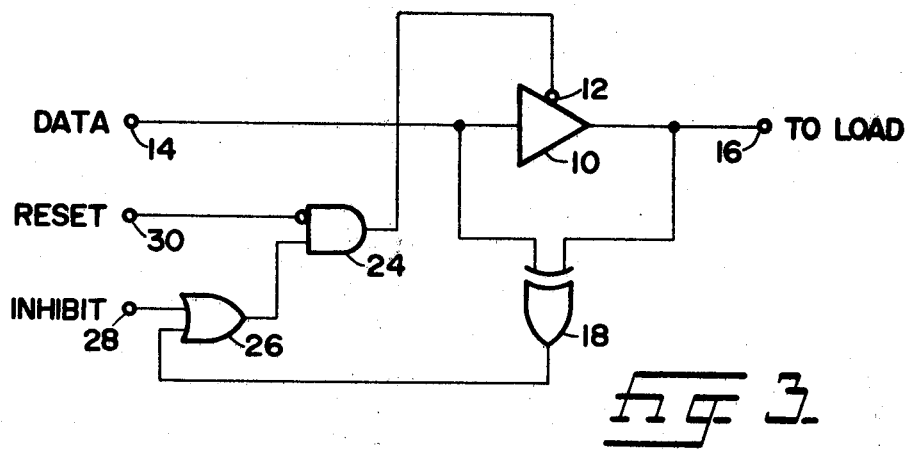
FIG. 3 shows a circuit schematic of a third embodiment according to the present invention.

FIG. 3 shows another embodiment based on FIG. 1. To reset the data drivers of FIGS. 1 and 2 to return to the normal mode of operation, it is necessary to apply the proper logic levels to output terminal 16. This point is improved by the embodiment of FIG. 3. Second and third logic gates 24 and 26 are inserted between exclusive OR gate 18 and enable terminal 12 of data driver 10. Third logic gate 26 is an OR gate to receive the output from exclusive OR gate 18 and an inhibit signal from terminal 28. Second logic gate 24 is an AND gate to receive the output from OR gate 26 and a reset signal from terminal 30.

In the normal state, the inhibit and reset signals are the low level. If the logic levels at terminals 14 and 16 are equal, the output from exclusive OR gate is the low level. The outputs from gates 24 and 26 are the low level to enable data driver 10. If the logic levels at terminals 14 and 16 are different, the outputs from gates 24 and 26 are the high level to cause the output of data driver 10 to go the tristate. To reset data driver 10, only the reset signal (the high level) is applied to terminal 30. When AND gate 24 receives the reset signal (after the fault is removed), the output logic level thereof changes so as to return data driver 10 to the normal mode of operation. The inhibit signal is used to inhibit data driver 10.

Figure 4:
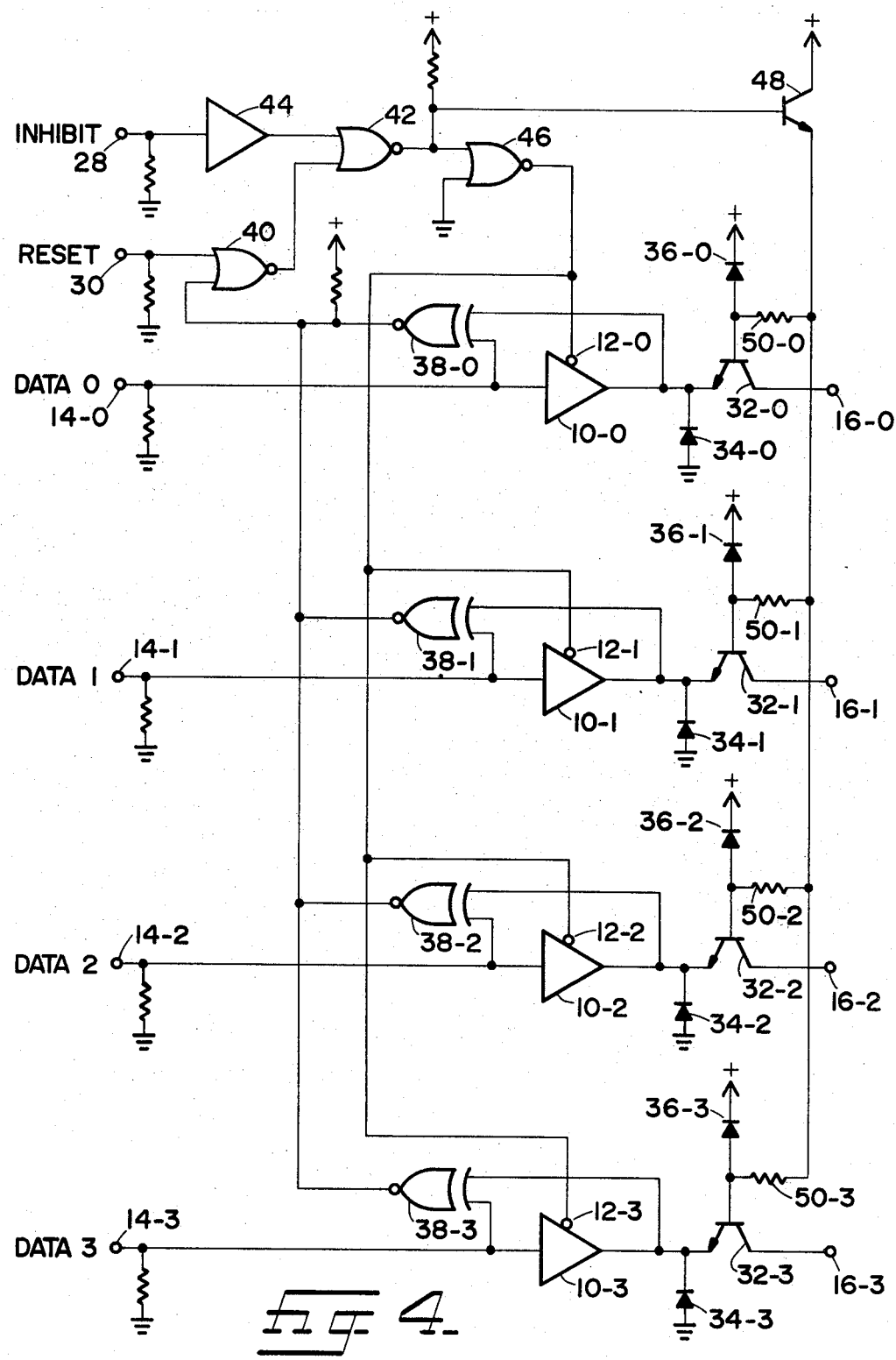
FIG. 4 shows a circuit schematic of a fourth embodiment according to the present invention.

FIG. 4 is a circuit schematic of four channel data output stages employing the present invention. The construction of each channel is the same. Series circuits consisting of data drivers 10 and transistors 32 are connected between data input terminals 14 and output terminals 16. Diodes 34 are connected between ground and the outputs of data drivers 10, and clamp diodes 36 are connected between a a positive voltage source and the bases of transistors 32. Exclusive NOR gates receive the outputs and inputs of data drivers 10, and apply the outputs to second logic gate or NOR gate 40. The four output terminals of exclusive NOR gates 10—0 through 10—3 are connected in common to form a wired-OR gate (negative logic). NOR gate 40 further receives the reset signal from terminal 30, and applies the output to NOR gate 42 which receives the inhibit signal from terminal 28 through buffer 44. The output from NOR gate 42 is applied to enable terminals (negative logic) 12 of data drivers 10 through NOR gate 46 acting as an inverter, and to the base of transistor 48 with the emitter connected to the bases of transistors 32 through resistors 50.

The operation of drivers 10 and gates 38-40-42-46 are similar to that of FIG. 3 except that all of drivers 10 are inhibited causing the outputs to go the tristate when the fault occurs in at least one channel. In this instance, transistors 32 are on. This embodiment includes another protection circuit for the data driver. If the outputs from data drivers 10 become negative, diodes 34 turn on to protect drivers 10. In the normal operation, the base of transistor 48 is the high level, and the base voltages of transistors 32 are determined by the collector voltage of transistor 48, resistors 50 and the base currents of transistors 32 because diodes 36 are off. When the outputs from data drivers 10 become larger than the base voltages of transistors 32, transistors 32 turn off to isolate output terminals 16 from drivers 10 to protect drivers 10. If the fault occurs in at least one channel, the base of transistor 48 is the low level, and transistors 32 turn off to isolate drivers 10 from output terminals 16 for further protecting drivers 10 from the damage. Transistors 32 are turned on by the reset signal at terminal 30. If the voltages at terminals 16 increase, the emitter and base voltages of transistors 32 increase because transistors 32 are on. However, the emitter voltages are less than the cathode voltages of diodes 36 because of the clamping operation of diodes 36.

While I have shown and described herein the preferred embodiments of my invention, it will become apparent to those skilled in the art that many changes and modifications may be made without departing from my invention in its broader aspects. For example, the output of the logic comparator circuit may be connected to a display device to indicate the fault. When the data driver includes a level converter function to convert a logic level such as the TTL level to another logic level such as the ECL level, a level converter may be inserted between the output of the data driver and the logic comparator circuit. If the propagation delay time of the data driver and/or the level converter cannot be ignored, a buffer amplifier may be inserted between the input of the data driver and the logic comparator circuit. For compensating the propagation delay time, a capacitor may be between the inputs of the logic comparator circuit.

What I claim as being novel is:

1. A protection circuit, comprising:
    an inhibitable data driver for generating an output logic signal in response to an input logic signal when said data driver is enabled; and
    a logic comparator circuit comprising a single logic gate for comparing said input and output logic signals of said data driver and inhibiting said data driver in response to the comparison result.

2. A protection circuit according to claim 1 wherein said data driver is a tristate driver, first and second states are that said data driver generates a high or low logic signal in response to said input logic signal with a low output impedance when said data driver is enabled, and a third state is that the output impedance of said data driver is high when said data driver is inhibited.

3. A protection circuit according to claim 1 wherein said logic comparator circuit is an exclusive OR gate.

4. A protection circuit according to claim 1 further including a second logic gate which inhibits or enables said data driver in response to the output from said logic comparator circuit and a reset signal.

5. A protection circuit according to claim 1 wherein said logic comparator circuit is an exclusive NOR gate.

6. A protection circuit, comprising:
    an inhibitable data driver for generating an output logic signal in response to an input logic signal when said data driver is enabled;
    a logic comparator circuit for comparing said input and output logic signals of said data driver and producing a comparison output signal in response to the comparison result; and a logic gate which inhibits or enables said data driver in response to said comparison output signal and a reset signal.

7. A new protection circuit in accordance with claim 6 wherein said logic comparator circuit comprises a single logic gate.

* * * * *